(12) United States Patent
Horii et al.

(10) Patent No.: US 10,020,746 B2
(45) Date of Patent: Jul. 10, 2018

(54) DC-DC CONVERTER WITH OVERVOLTAGE PROTECTION

(71) Applicant: Murata Manufacturing Co., Ltd., Nagaokakyo-shi, Kyoto-fu (JP)

(72) Inventors: Hiroyuki Horii, Nagaokakyo (JP); Koichi Ueki, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 15/678,243

(22) Filed: Aug. 16, 2017

(65) Prior Publication Data
US 2017/0346409 A1     Nov. 30, 2017

Related U.S. Application Data

(63) Continuation of application No. PCT/JP2016/050180, filed on Jan. 6, 2016.

(30) Foreign Application Priority Data

Feb. 17, 2015 (JP) .................................. 2015-028358

(51) Int. Cl.
*H02M 3/335* (2006.01)
*H02M 1/32* (2007.01)
(Continued)

(52) U.S. Cl.
CPC ......... *H02M 3/33523* (2013.01); *H02M 1/08* (2013.01); *H02M 1/32* (2013.01); *H03H 7/0115* (2013.01)

(58) Field of Classification Search
CPC .................................. H02M 1/08; H02M 1/32
See application file for complete search history.

(56) References Cited

U.S. PATENT DOCUMENTS 3,304,489 A * 2/1967 Brolin .................. H02M 3/156
                                                                 323/286
3,536,958 A * 10/1970 Sondermeyer .......... C01B 17/20
                                                                  327/545

(Continued)

FOREIGN PATENT DOCUMENTS

JP    2007-089292 A    4/2007
JP    2014-187825 A    4/2007

(Continued)

OTHER PUBLICATIONS

International Search Report issued in International Application No. PCT/JP2016/050180, dated Apr. 5, 2016.

(Continued)

*Primary Examiner* — Yusef A Ahmed
(74) *Attorney, Agent, or Firm* — Arent Fox LLP

(57) ABSTRACT

A DC-DC converter includes a filter circuit, a full-bridge circuit connected to the filter circuit, and a transformer having a primary winding and a secondary winding, the primary winding being connected to the full-bridge circuit. The full-bridge circuit includes first to fourth semiconductor switches. First to fourth overvoltage protection circuits are associated with the first to fourth semiconductor switches, respectively. Each of the overvoltage protection circuits is connected in parallel its associated semiconductor switch.

10 Claims, 10 Drawing Sheets

(51) Int. Cl.
*H02M 1/08* (2006.01)
*H03H 7/01* (2006.01)

(56) References Cited

U.S. PATENT DOCUMENTS

| | | | | | |
|---|---|---|---|---|---|
| 4,027,203 | A | * | 5/1977 | Moran | H02H 3/093 361/89 |
| 4,792,885 | A | * | 12/1988 | Cuman | H02M 1/08 361/91.7 |
| 4,819,144 | A | * | 4/1989 | Otake | H02M 3/33507 363/131 |
| 5,808,879 | A | * | 9/1998 | Liu | H02M 3/337 323/222 |
| 5,812,385 | A | * | 9/1998 | Leu | H02M 1/36 363/49 |
| 6,069,798 | A | * | 5/2000 | Liu | H02M 3/33569 363/134 |
| 7,821,797 | B2 | | 10/2010 | Nishiyama et al. | |
| 2002/0196002 | A1 | * | 12/2002 | Diallo | H02M 1/38 323/276 |
| 2003/0048645 | A1 | * | 3/2003 | Hosotani | H02M 3/3385 363/21.12 |
| 2005/0141161 | A1 | * | 6/2005 | Usui | H02M 1/32 361/93.1 |
| 2008/0291702 | A1 | * | 11/2008 | Hosotani | H02M 3/33569 363/21.02 |
| 2010/0103703 | A1 | * | 4/2010 | Nishiyama | H02M 3/3376 363/17 |
| 2010/0195353 | A1 | * | 8/2010 | Nishiyama | H02M 1/40 363/20 |
| 2010/0277132 | A1 | * | 11/2010 | Hara | B60L 11/1864 320/163 |
| 2010/0309701 | A1 | * | 12/2010 | Wu | H02M 3/33592 363/127 |
| 2011/0305047 | A1 | * | 12/2011 | Jungreis | H02M 1/08 363/21.02 |
| 2012/0286689 | A1 | * | 11/2012 | Newman, Jr. | H05B 41/2828 315/246 |
| 2013/0242617 | A1 | * | 9/2013 | Zhang | H02M 3/33569 363/17 |
| 2015/0055374 | A1 | * | 2/2015 | Yamashita | H02M 3/337 363/17 |
| 2016/0072390 | A1 | * | 3/2016 | Akutagawa | H02M 3/33584 363/17 |
| 2016/0211690 | A1 | * | 7/2016 | Li | H02J 7/0052 |
| 2017/0324347 | A1 | * | 11/2017 | Xu | H02M 3/33584 |

FOREIGN PATENT DOCUMENTS

| | | | | |
|---|---|---|---|---|
| JP | 2013-055859 | A | | 3/2013 |
| JP | 2013055859 | A | * | 3/2013 |
| JP | 2014-176226 | A | | 9/2014 |
| JP | 2014187825 | A | * | 10/2014 | H02M 1/08 |
| WO | WO 2009/011374 | A1 | | 1/2009 |

OTHER PUBLICATIONS

Written Opinion of the International Searching Authority issued in International Application No. PCT/JP2016/050180, dated Apr. 5, 2016.

* cited by examiner

DC-DC CONVERTER WITH OVERVOLTAGE PROTECTION

CROSS REFERENCE TO RELATED APPLICATIONS

The present application is a continuation of International application No. PCT/JP2016/050180, filed Jan. 6, 2016, which claims priority to Japanese Patent Application No. 2015-028358, filed Feb. 17, 2015, the entire contents of each of which are incorporated herein by reference.

TECHNICAL FIELD

The present invention relates to half-bridge and full-bridge DC-DC converters.

BACKGROUND ART

International Publication No. 2009/011374 describes an isolated DC-DC converter. The primary side of a transformer of this DC-DC converter is configured such that an LC filter circuit and a switching circuit are connected, in order, to an input power source. There is provided a current transformer between the filter circuit and the switching circuit and this current transformer detects a current flowing in the primary side. When the detected current is greater than or equal to a predetermined value, overcurrent protection control is performed.

When a step-like voltage is applied to the filter circuit, for example, at the time when a power source is turned on in the DC-DC converter described in the foregoing International Publication, the filter circuit's inductance causes a surge voltage greater than the input voltage. In the case where this surge voltage is applied to the switching circuit, FETs that constitute the switching circuit and that are connected in series may be damaged by the surge voltage. In addition, in the case where there are variations in the parasitic capacitances of the series-connected FETs, a capacitance ratio becomes out of balance. In this case, when the surge voltage is applied to the switching circuit, the surge voltage may be greater than the voltages that the FETs can resist. As a result, high-voltage FETs need to be used as switching elements, resulting in a high-cost.

A primary objective of the present invention is to provide a DC-DC converter that can prevent, at low cost, switching elements from being damaged by surge voltage.

BRIEF DESCRIPTION OF THE INVENTION

In accordance with one aspect of the invention, a DC-DC converter, includes a filter circuit, a full-bridge circuit connected to the filter circuit, and a transformer having a primary winding and a secondary winding, the primary winding being connected to the full-bridge circuit. The full-bridge circuit includes first to fourth semiconductor switches. First to fourth overvoltage protection circuits are associated with the first to fourth semiconductor switches, respectively. Each of the overvoltage protection circuits is connected in parallel its associated semiconductor switch.

In the preferred embodiments, at least the first semiconductor switch has a source and a drain and a design parasitic capacitance between its source and drain. In at least some embodiments, the first overvoltage protection circuit is a capacitor whose capacitance is equal to the design parasitic capacitance of the first semiconductor switch within an error range of ±5%. The capacitor is preferably one or more discrete capacitors. In at least one embodiment, each of the first through fourth overvoltage protection circuits includes a capacitance circuit whose capacitance is equal to the design parasitic capacitance of its associated semiconductor switch within an error range of +5%.

According to some aspects of the invention, the first overvoltage protection circuit includes a series circuit comprising a resistor and an electronic switch and a switching circuit that turns on the electronic switch when a voltage applied to the semiconductor switch is greater than or equal to a threshold. The threshold is preferably less than a value at which the first semiconductor switch is damaged.

In another aspect of the invention two of the overvoltage protection circuits include a first series circuit comprising a first resistor and a first electronic switch and a first switching circuit that turns on the first electronic switch when a voltage applied to the first semiconductor switch is greater than or equal to a first threshold. The first threshold is preferably less than the withstand voltage of its associated semiconductor switch.

In another aspect of the invention, two of the overvoltage protection circuits include a first series circuit comprising a first resistor and a first electronic switch and a first switching circuit that turns on the first electronic switch when a voltage applied to the first semiconductor switch is less than a withstand voltage of its associated semiconductor switch and the remaining two overvoltage protection circuits include a capacitance circuit whose capacitance is equal to a design parasitic capacitance of its associated semiconductor switch within an error range of ±5%. The associated parasitic capacitance of its associated semiconductor switch being measured between a source and a drain of its associated semiconductor switch.

In another aspect of the invention, all four overvoltage protection circuits include a first series circuit comprising a first resistor and a first electronic switch and a first switching circuit that turns on the first electronic switch when a voltage applied to its associated semiconductor switch is less than the withstand voltage of its associated semiconductor switch.

In a preferred embodiment, DC-DC converter further comprising a rectifying and smoothing circuit that is connected to the secondary winding of the transformer and that rectifies, smoothes, and then outputs an alternating-current voltage generated at the secondary winding. The DC-DC converter further preferably includes a pair of input terminals adapted to be connected to a DC source, the input terminals being connected to an input of the filter circuit.

In another aspect of the invention, the DC-DC converter includes a filter circuit, a half-bridge circuit connected to the filter circuit, and a transformer having a primary winding and a secondary winding, the primary winding being connected to the full-bridge circuit. The half-bridge circuit includes first and second semiconductor switches. First and second overvoltage protection circuits are associated with the first and second semiconductor switches, respectively. Each of the overvoltage protection circuits is connected in parallel its associated semiconductor switch.

Each of the semiconductor switches preferably have a source and a drain and a design parasitic capacitance between its source and drain. In one aspect of the invention, the first and second overvoltage protection circuits each comprise a capacitor whose capacitance is equal to the design parasitic capacitance of its associated semiconductor switch within an error range of ±5%.

In another aspect of the invention, the first overvoltage protection circuit comprises a capacitor whose capacitance is equal to the parasitic capacitance of the first semiconductor switch within an error range of ±5% and the second overvoltage protection circuit includes a series circuit comprising a resistor and an electronic switch and a switching circuit that turns on the electronic switch when a voltage applied to the second semiconductor switch is greater than or equal to a threshold which is preferably less than the withstand voltage of the second semiconductor switch.

In another aspect of the invention, each of the overvoltage protection circuits include a first series circuit comprising a first resistor and an electronic switch and a first switching circuit that turns on the first electronic switch when a voltage applied to the first semiconductor switch is greater than or equal to a threshold. The threshold for each overvoltage protection circuit is preferably less than the withstand voltage of its associated semiconductor switch.

In another aspect of the invention, the DC-DC converter using a half-bridge circuit further includes a rectifying and smoothing circuit that is connected to the secondary winding of the transformer and that rectifies, smoothes, and then outputs an alternating-current voltage generates at the secondary winding. The DC-DC converter preferably further including a pair of input terminals adapted to be connected to a DC source, the input terminals being connected to an input of the filter circuit.

DESCRIPTION OF EMBODIMENTS

First Embodiment

Figure 1:
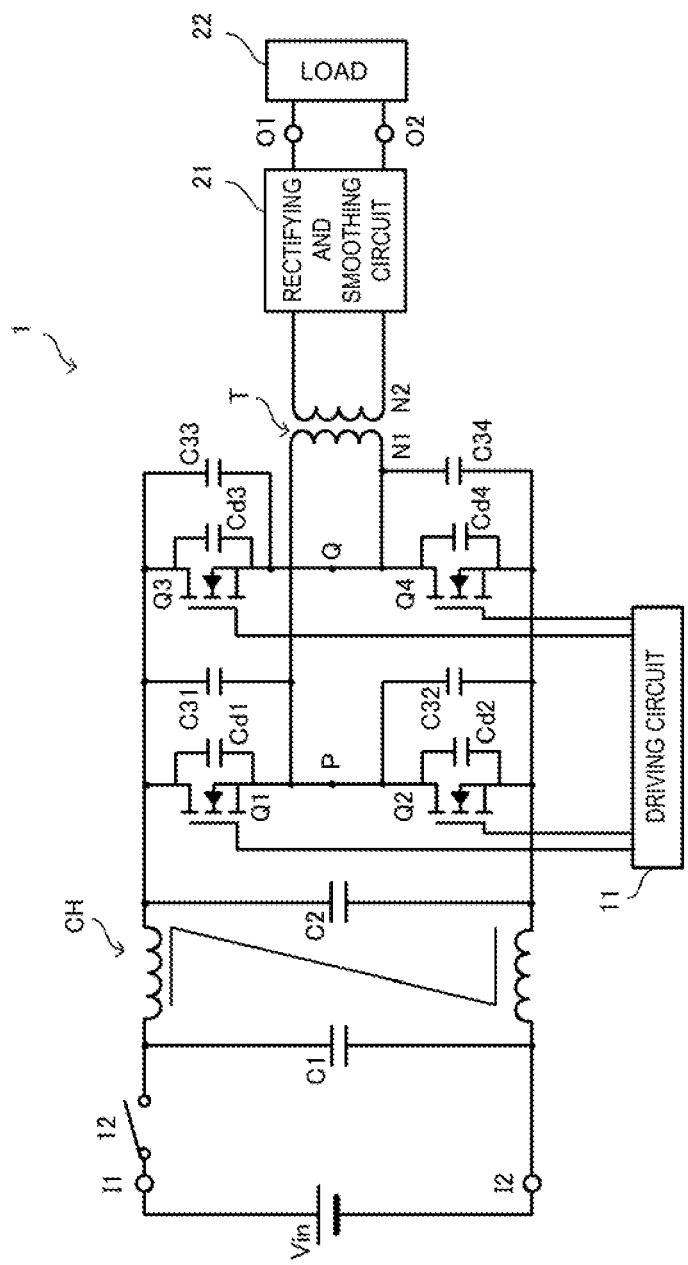
FIG. 1 is a circuit diagram of a DC-DC converter according to a first embodiment.

FIG. 1 is a circuit diagram of a DC-DC converter 1 according to a first embodiment. The DC-DC converter 1 according to the present embodiment. The DC-DC converter 1 includes input terminals I1 and I2 and output terminals O1 and O2. A direct-current power source Vin is connected to the input terminals I1 and I2. A load 22 is connected to the output terminals O1 and O2.

A switch element 12 and a filter circuit, preferably constituted by a common mode choke coil CH and bypass capacitors C1 and C2, are connected to the direct-current power source Vin as shown. When power is turned on, the switch element 12 is closed and a step-like voltage is applied to the filter circuit.

A switching circuit (full-bridge circuit) is connected to the output side of the filter circuit. In the switching circuit, a series circuit constituted by semiconductor switches Q1 and Q2 is connected in parallel with a series circuit constituted by semiconductor switches Q3 and Q4. The semiconductor switches Q1 to Q4 are preferably MOS-FETs.

The semiconductor switches Q1 to Q4 have parasitic capacitances Cd1, Cd2, Cd3, and Cd4 formed between their respective drain and the source. The gates of the semiconductor switches Q1 to Q4 are connected to a driving circuit 11. The driving circuit 11 alternately switches the semiconductor switches Q1 and Q4 on the one hand and the semiconductor switches Q2 and Q3 on the other, on and off. As a result, the switching circuit converts the direct-current voltage input from the filter circuit into an alternating-current voltage.

A primary winding N1 of a transformer T is connected to the output side of the switching circuit. A rectifying and smoothing circuit 21 is connected to a secondary winding N2 of the transformer T. The rectifying and smoothing circuit 21 includes, for example, a rectifier diode, an inductor, and a capacitor. The rectifying and smoothing circuit 21 rectifies and smoothes an alternating-current voltage induced in the secondary winding N2 of the transformer T, and outputs the resultant to the load 22 connected to the output terminals O1 and O2.

First to fourth overvoltage protection capacitors C31, C32, C33, and C34 are connected in parallel with the semiconductor switches Q1, Q2, Q3, and Q4, respectively. The overvoltage protection capacitors C31 and C32 prevent the semiconductor switches Q1 and Q2 from being damaged by the application of an overvoltage in the case where a surge voltage is applied to the series circuit constituted by the semiconductor switches Q1 and Q2. The overvoltage protection capacitors C33 and C34 prevent the semiconductor switches Q3 and Q4 from being damaged by the application of overvoltage to the series circuit constituted by the semiconductor switches Q3 and Q4. The capacitors C31-C34 are preferably individual discrete capacitors but can be more complex capacitive networks.

In the case where the switch element 12 is turned on and the step-like overvoltage is applied to the filter circuit, a surge voltage greater than the input voltage may be output from the filter circuit. The surge voltage may be up to twice the input voltage.

The switching elements Q1 and Q2 are preferably the same in construction, and thus their parasitic capacitances Cd1 and Cd2 will have the same design capacitance (the design capacitance is sometimes referred to as the design or output capacitance of the FET). When the parasitic capacitances Cd1 and Cd2 are the same, the same voltage is applied to the switching elements Q1 and Q2 due to capacitor voltage division. Thus, even when a surge voltage that is twice the input voltage is input to the series circuit constituted by the switching elements Q1 and Q2, voltage Vp at a connection point P of the switching elements Q1 and Q2 is Vp=Vo/2=Vi, where the input voltage to the filter circuit represents Vi and the output voltage represents Vo. Up to the same voltage as the input voltage Vi to the filter circuit is applied to the switching elements Q1 and Q2 individually.

However, the parasitic capacitances Cd1 and Cd2 may vary from their design value by up to about ±40%. In this case, a voltage greater than the voltage Vi may be applied as the voltage Vp at the connection point P, and either of the switching elements Q1 and Q2 may be damaged. For example, there may be a case where the design capacitance for the parasitic capacitances Cd1 and Cd2 is Cds, the voltage Vp at the connection point P becomes 1.4Vi due to these variations, overvoltage is applied to the switching element Q2, and the switching element Q2 is damaged.

In the present embodiment, the capacitors C31 and C32 are connected in parallel with the switching elements Q1 and Q2. The capacitors C31 and C32 are designed such that the ratio between a combined capacitance of the parasitic capacitance Cd1 and the capacitor C31 on the one hand and a combined capacitance of the parasitic capacitance Cd2 and the capacitor C32 on the other approaches approximately 1:1. More specifically, the capacitor C31 is set such that its capacitance is equal to the design value of the parasitic capacitance Cds of the switching element Q1 preferably within an error range of ±5%. In addition, the capacitor C32 is set such that its capacitance is equal to the design value of the parasitic capacitance Cds of the switching element Q2 within an error range of preferably ±5%.

Let's assume that the capacitance of the capacitor C31 is 0.95Cds, that is the parasitic capacitance Cds with an error of −5%, and the capacitance of the capacitor C32 is 1.05Cds, that is the parasitic capacitance Cds with an error of +5%. In the case where the parasitic capacitance Cd1 is a capacitance of 0.6Cds and the parasitic capacitance Cd2 is a capacitance of 1.4Cds, the voltage Vp at the connection point P is Vp=(1/1.4+1/1.05)−1/{(1/0.6+1/0.95)−1+(1/1.4+1/1.05)−1}*2Vi=1.22Vi. As described above, in the case where the capacitors C31 and C32 are not provided, the voltage Vp at the connection point P is 1.4Vi. The voltage Vp thus becomes lower than in the case where the capacitors C31 and C32 are provided. In this manner, the provision of the capacitors C31 and C32 can prevent the application of overvoltage to the switching elements Q1 and Q2.

The series circuit constituted by the semiconductor switches Q3 and Q4 is preferably connected in parallel with the series circuit constituted by the semiconductor switches Q1 and Q2. Thus, the series circuit constituted by the semiconductor switches Q3 and Q4 can be described similarly to the series circuit constituted by the semiconductor switches Q1 and Q2. That is, the capacitor C33 is set such that its capacitance is equal to the design value of the parasitic capacitance Cds of the semiconductor switch Q3 within an error range of ±5%. In addition, the capacitor C34 is set such that its capacitance is equal to the design value of the parasitic capacitance Cds of the semiconductor switch Q4 within an error range of ±5%. As a result, voltage Vq at a connection point Q of the semiconductor switches Q3 and Q4 can be lowered than in the case where the capacitors C33 and C34 are not provided.

As described above, the semiconductor switches Q1 to Q4 are provided with the capacitors C31 to C34, respectively, and the capacitances of the overvoltage protection capacitors C31 to C34 are made to be equal to the design value of the parasitic capacitances of the parasitic capacitances Cd1 to Cd4 within an error range of ±5%. Consequently, the application of an overvoltage to the semiconductor switches Q1 to Q4 can be prevented. As a result, the semiconductor switches Q1 to Q4 can be prevented from being damaged.

Second Embodiment

Figure 2:
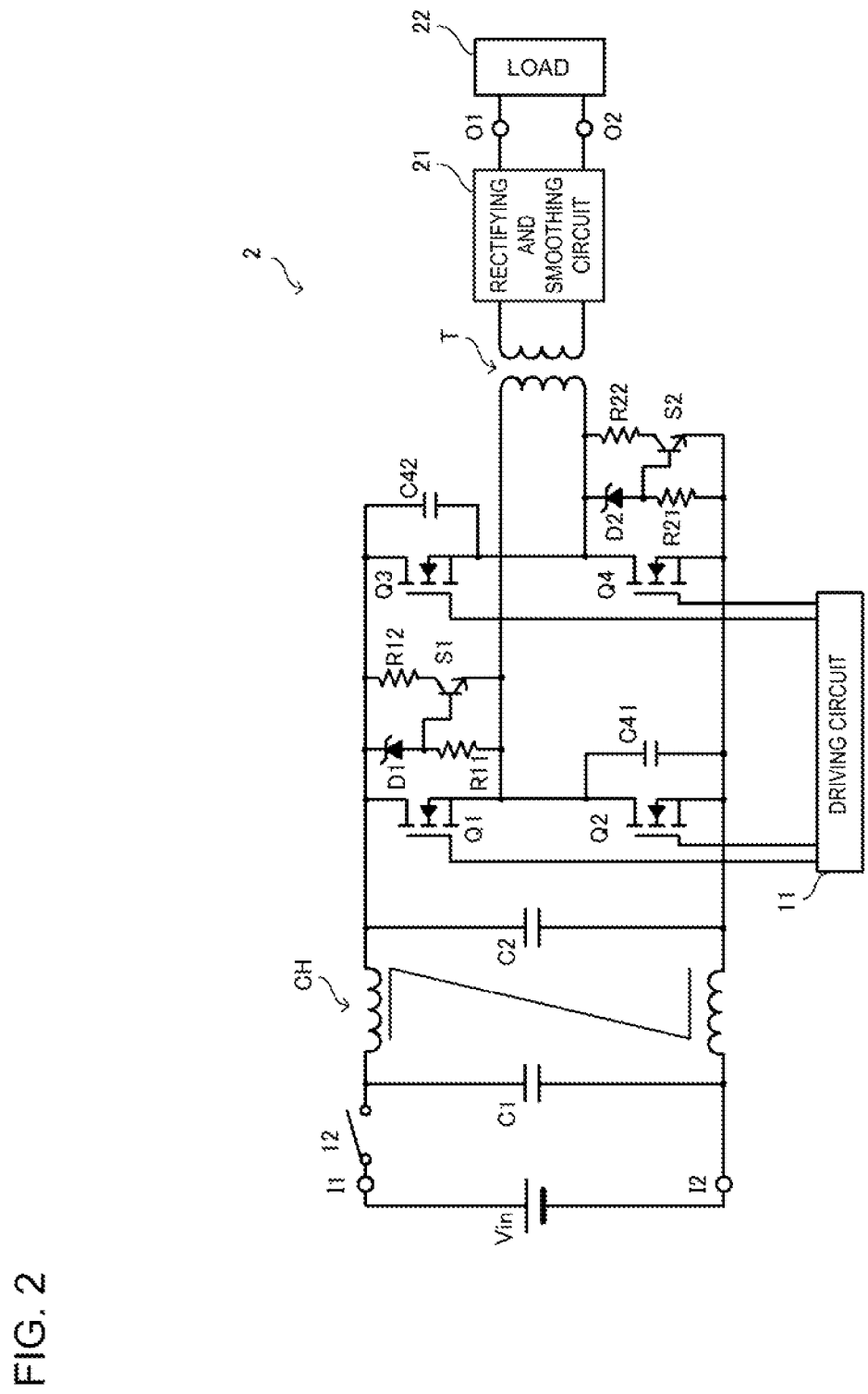
FIG. 2 is a circuit diagram of a DC-DC converter according to a second embodiment.

FIG. 2 is a circuit diagram of a DC-DC converter 2 according to a second embodiment. In FIG. 2, the illustration of parasitic capacitances Cd1 to Cd4 of semiconductor switches Q1 to Q4 is omitted. In this example, a circuit configuration with which the application of an overvoltage to the semiconductor switches Q1 to Q4 is prevented differs from that of the first embodiment. The differences will be described in the following.

In the DC-DC converter 2, two of the overvoltage protection circuits are overvoltage protection capacitors and two are discharge switch circuits (which are connected in parallel with first and fourth semiconductor switches Q1 and Q4 of a switching circuit). More specifically, a series circuit constituted by a Zener diode D1 and a resistor R11 and a series circuit constituted by a resistor R12 and a switch S1 are connected in parallel with respect to the semiconductor switch Q1. The electronic switch S1 is preferably a transistor, and its base is connected to a connection point between the Zener diode D1 and the resistor R11. Likewise, a series circuit constituted by a Zener diode D2 and a resistor R21 and a series circuit constituted by a resistor R22 and an electronic switch S2 are connected in parallel with respect to the switching element Q4.

Overvoltage protection capacitors C41 and C42 are connected in parallel with semiconductor switches Q2 and Q3, respectively. The capacitors C41 and C42 preferably have a capacitance equal to the design value of the parasitic capacitance of the semiconductor switches Q2 and Q3, respectively, within an error range of ±5%.

The Zener voltage of the Zener diode D1 is preferably set to a value at which the electronic switch S1 is turned on when a voltage greater than or equal to the direct-current power source Vin is applied across the drain and source of the semiconductor switch Q1. This prevents any voltage greater than or equal to the direct-current power source Vin from being applied across the drain and source of the semiconductor switch Q1. That is, when an overvoltage is applied to the semiconductor switch Q1 and the Zener diode D1 is turned on, the electronic switch S1 is turned on and the energy of the overvoltage applied to the semiconductor switch Q1 is consumed by the resistor R12. As a result, the application of overvoltage to the semiconductor switch Q1 can be prevented.

The series circuits of the semiconductor switches Q3 and Q4 operate similarly to the series circuits of the semiconductor switches Q1 and Q2. Note that the thresholds of the Zener diodes D1, D2 are preferably set to be greater than or equal to the voltage of the direct-current power source Vin and less than the withstand voltages of the semiconductor switches Q1 and Q4.

FIGS. 3, 4, 5, and 6 are circuit diagrams of DC-DC converters that are other examples according to the second embodiment.

Figure 3:
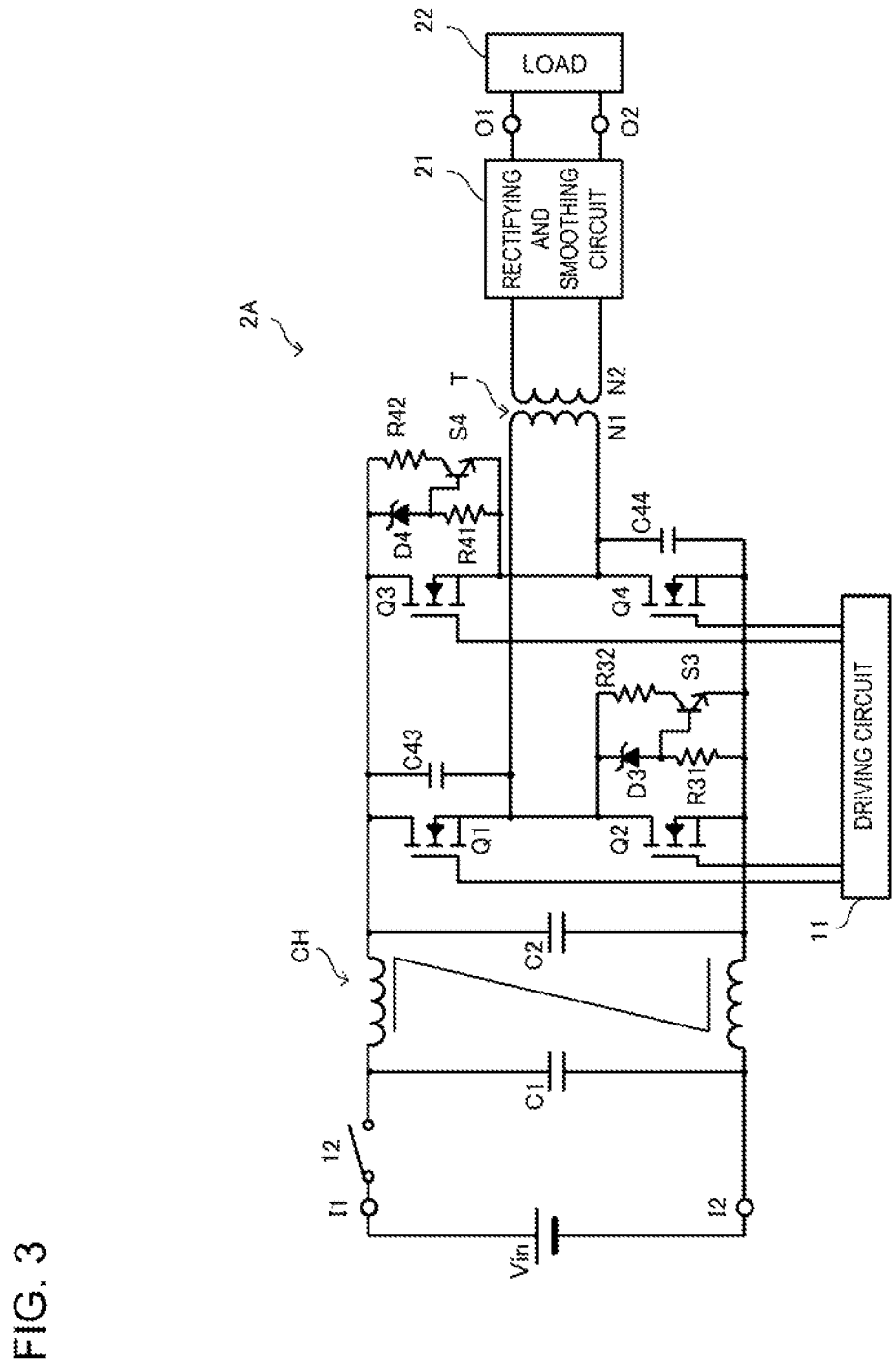
FIG. 3 is a circuit diagram of a DC-DC converter that is another example according to the second embodiment.

A DC-DC converter 2A illustrated in FIG. 3 differs from the DC-DC converter 2 illustrated in FIG. 2 in that discharge switch circuits are connected in parallel with the semiconductor switches Q2 and Q3. In the DC-DC converter 2A, a capacitor C43 is connected in parallel with the semiconductor switch Q1. A series circuit constituted by a Zener diode D3 and a resistor R31 and a series circuit constituted by a resistor R32 and an electronic switch S3 are connected in parallel with the semiconductor switch Q2. In addition, a series circuit constituted by a Zener diode D4 and a resistor R41 and a series circuit constituted by a resistor R42 and an electronic switch S4 are connected in parallel with the switching element Q3. An overvoltage protection capacitor C44 is connected in parallel with the semiconductor switch Q4. The overvoltage protection capacitors C43 and C44 preferably have a capacitance equal to the design value of the parasitic capacitance of the semiconductor switches Q1 and Q3, respectively, within an error range of ±5%. With this circuit configuration, the application of overvoltage to the semiconductor switches Q1 to Q4 can be prevented.

Figure 4:
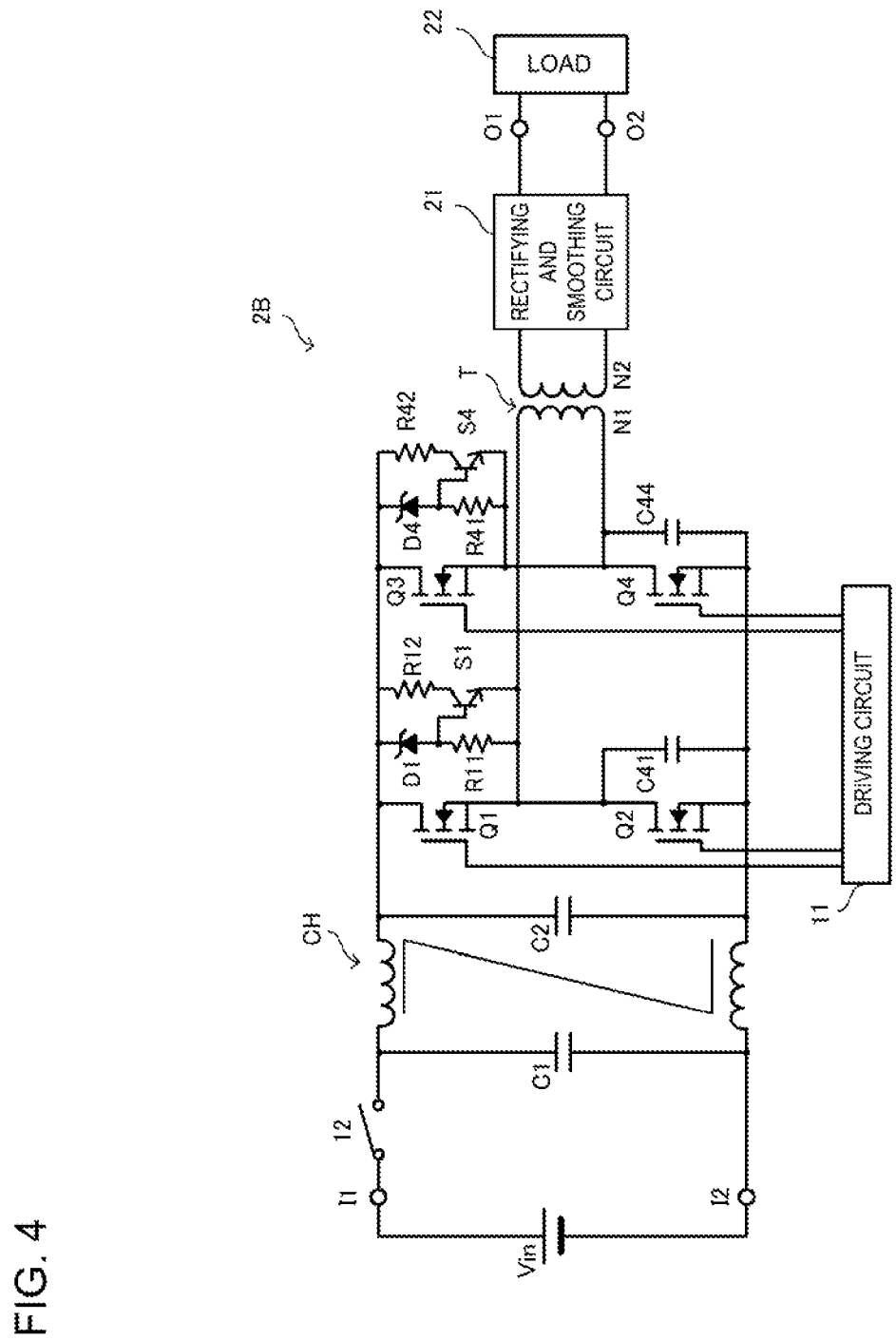
FIG. 4 is a circuit diagram of a DC-DC converter that is another example according to the second embodiment.

In a DC-DC converter 2B illustrated in FIG. 4, discharge switch circuits are connected in parallel with the semiconductor switches Q1 and Q3. The overvoltage protection capacitor C41 is connected in parallel with the semiconductor switch Q2. The overvoltage protection capacitor C44 is connected in parallel with the semiconductor switch Q4. The capacitors C41 and C44 preferably have a capacitance equal to the design value of the parasitic capacitance of the semiconductor switches Q2 and Q4, respectively, within an error range of ±5%.

Figure 5:
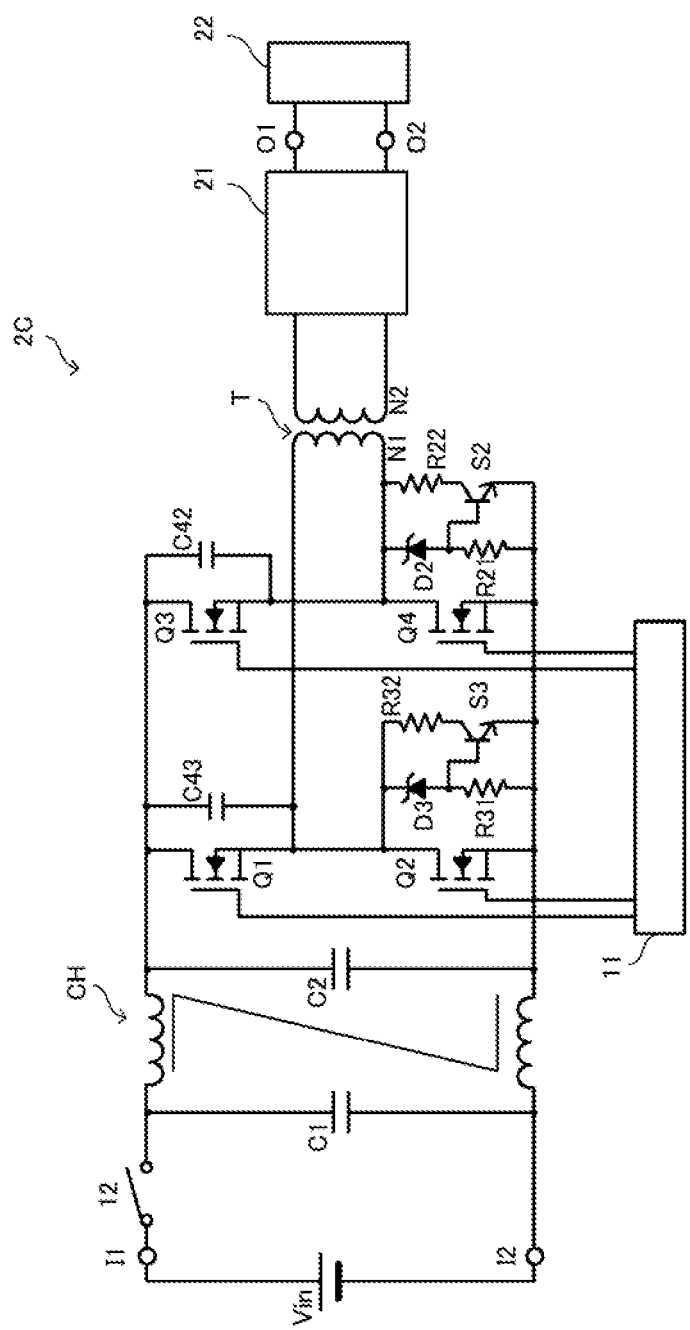
FIG. 5 is a circuit diagram of a DC-DC converter that is another example according to the second embodiment.

In a DC-DC converter 2C illustrated in FIG. 5, discharge switch circuits are connected in parallel with the semiconductor switches Q2 and Q4. An overvoltage protection capacitor C43 is connected in parallel with the semiconductor switch Q1 and the overvoltage protection capacitor C42 is connected in parallel with the semiconductor switch Q3. The capacitors C43 and C44 preferably have a capacitance equal to the design value of the parasitic capacitance of the semiconductor switches Q1 and Q3, respectively within an error range of ±5%. Like the foregoing embodiments, this circuit configuration can prevent the application of overvoltage to the semiconductor switches Q1 to Q4.

Figure 6:
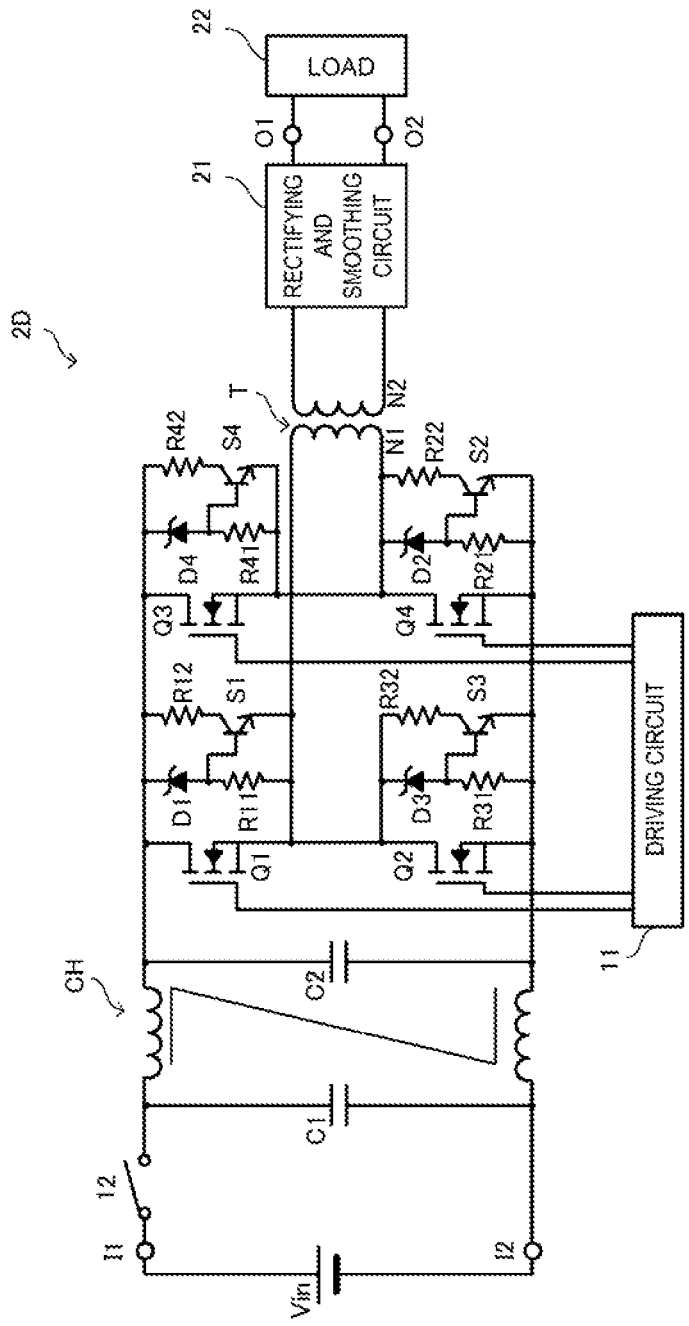
FIG. 6 is a circuit diagram of a DC-DC converter that is another example according to the second embodiment.

In a DC-DC converter 2D illustdesign in FIG. 6, a respective discharge switch circuit is connected in parallel with each of the semiconductor switches Q1 to Q4. Once again, this circuit configuration can prevent the application of overvoltage to the semiconductor switches Q1 to Q4.

Third Embodiment

Figure 7:
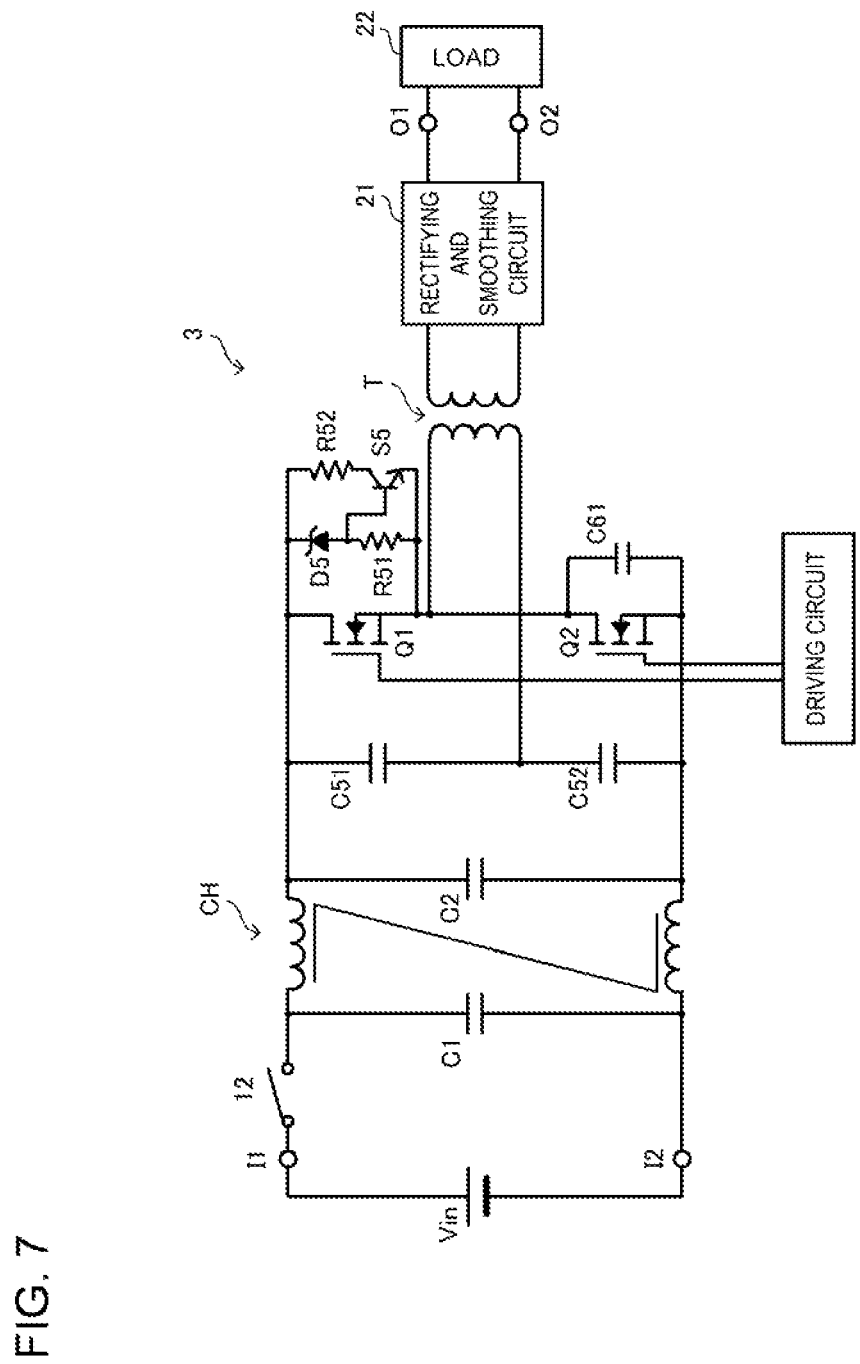
FIG. 7 is a circuit diagram of a DC-DC converter according to a third embodiment.

FIG. 7 is a circuit diagram of a DC-DC converter 3 according to a third embodiment. The DC-DC converter 3 according to the present embodiment is a half-bridge circuit in which a series circuit constituted by capacitors C51 and C52 is connected in parallel with a series circuit constituted by semiconductor switches elements Q1 and Q2.

In the DC-DC converter 3, a discharge switch circuit (acting as an overvoltage protection circuit) is connected in parallel with the semiconductor switch Q1 on the high side. The discharge switch circuit comprises a series circuit constituted by a Zener diode D5 and a resistor R51 and a series circuit constituted by a resistor R52 and an electronic switch S5 which are connected in parallel with the semiconductor switch Q1. In addition, an overvoltage protection capacitor C61 is connected in parallel with the semiconductor switch Q2 on the low side. The capacitor C61 preferably has a capacitance equal to the design value of a parasitic capacitance of the semiconductor switch Q2 within an error range of ±5%. With this circuit configuration, like the foregoing embodiments, the application of overvoltage to the semiconductor switches Q1 and Q2 can be prevented.

Figure 8:
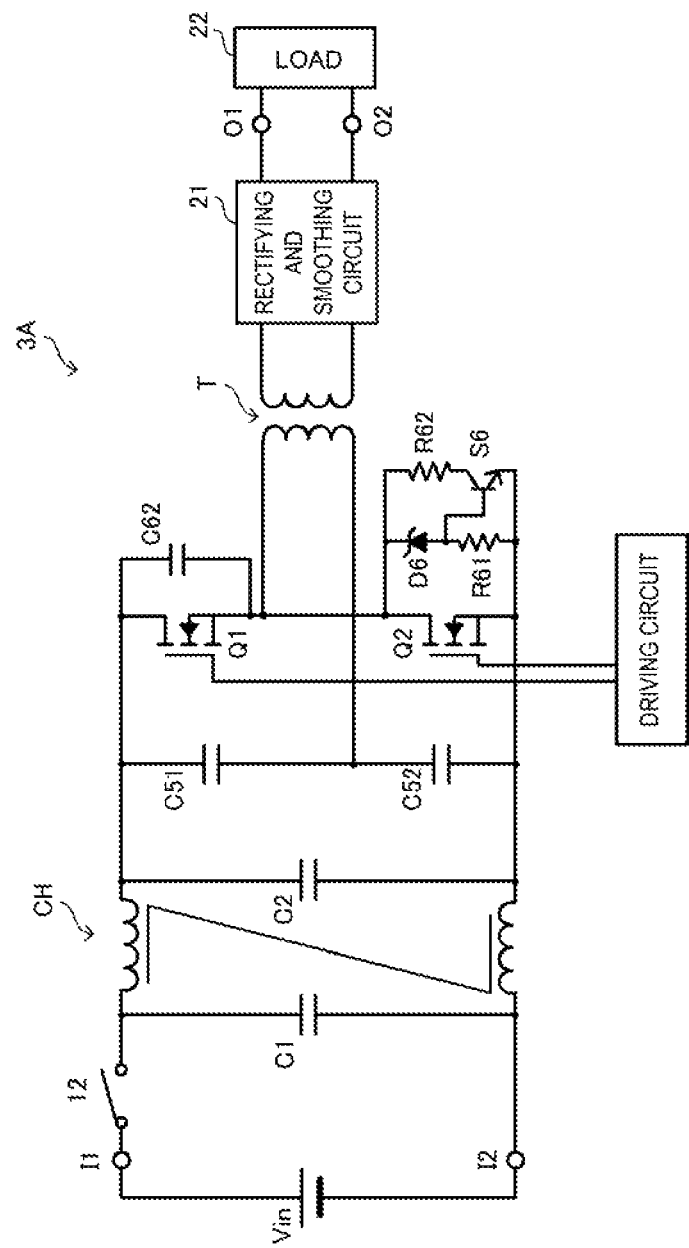
FIG. 8 is a circuit diagram of a DC-DC converter that is another example according to the third embodiment.
Figure 9:
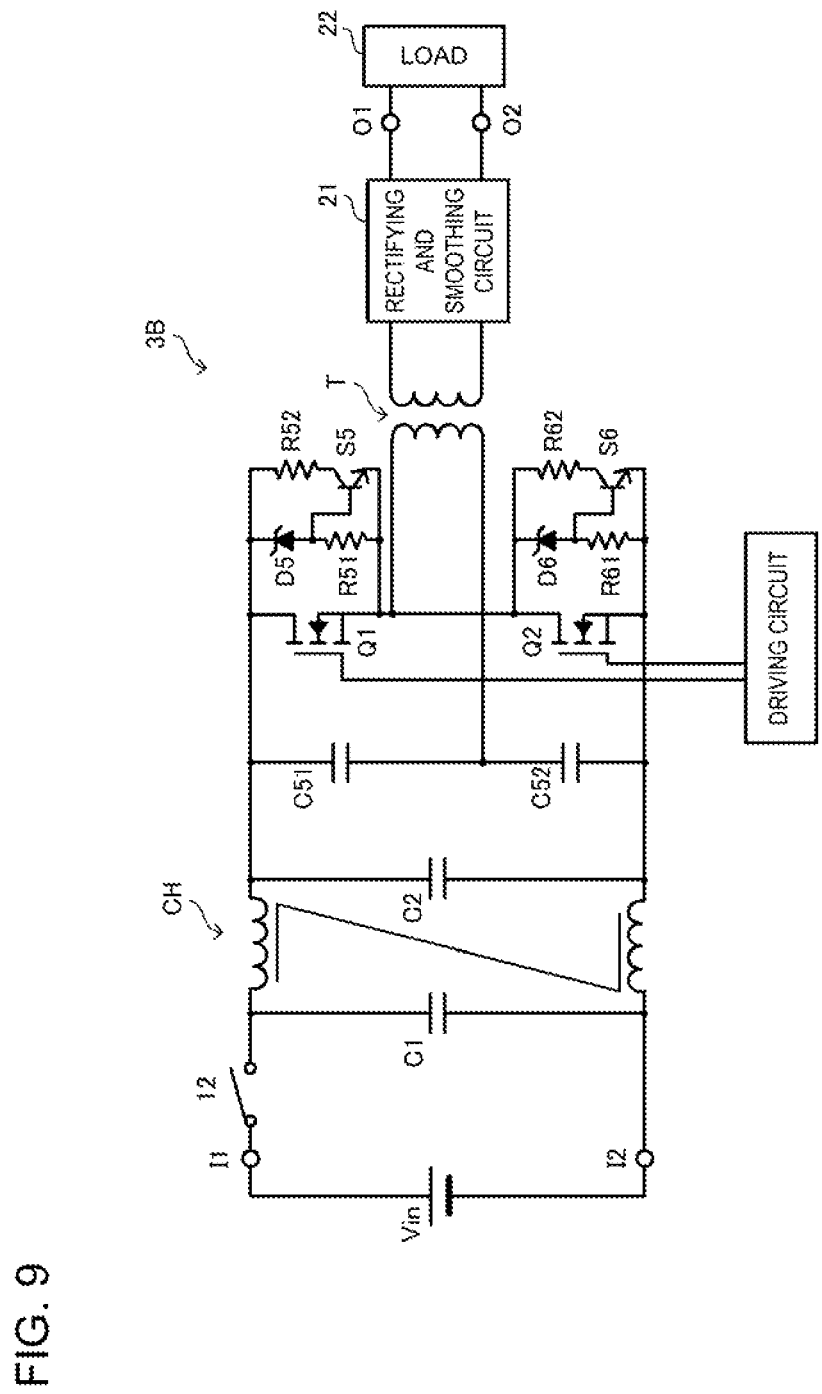
FIG. 9 is a circuit diagram of a DC-DC converter that is another example according to the third embodiment.

FIGS. 8 and 9 are circuit diagrams of DC-DC converters that are other examples according to the third embodiment.

In a DC-DC converter 3A illustdesign in FIG. 8, a discharge switch circuit is connected in parallel with the semiconductor switch Q2. An overvoltage protection capacitor C62 is connected in parallel with the semiconductor switch Q1. Once again, this circuit configuration can prevent the application of overvoltage to the semiconductor switches Q1 and Q2.

In a DC-DC converter 3B illustdesign in FIG. 9, a discharge switch circuit is connected in parallel with each of the semiconductor switches Q1 and Q2. Like the foregoing embodiments, this circuit configuration can prevent the application of overvoltage to the semiconductor switches Q1 and Q2.

Figure 10:
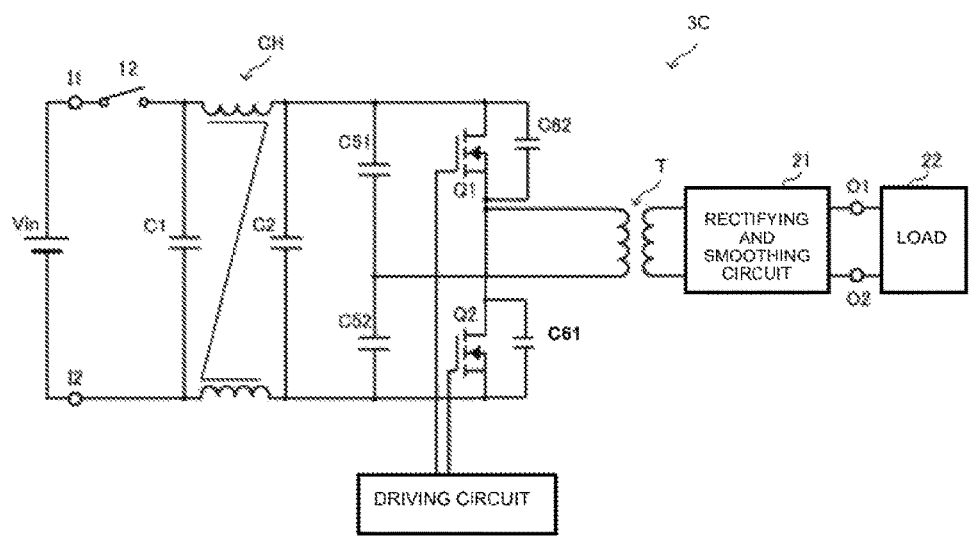
FIG. 10 is a circuit diagram of a DC-DC converter that is another example according to the third embodiment.

In a DC-DC converter 3C illustdesign in FIG. 10, overvoltage protection capacitors C62 and C61 are connected in parallel with the semiconductor switches Q1 and Q2, respectively. The capacitors C62 and C61 prevent the semiconductor switches Q1 and Q2 from being damaged by the application of overvoltage in the case where surge voltage is applied to the series circuit constituted by the semiconductor switches Q1 and Q2. The overvoltage protection capacitors C62 and C61 preferably have a capacitance equal to the design value of a parasitic capacitance of the semiconductor switches Q3 and Q4, respectively, within an error range of ±5%.

REFERENCE SIGNS LIST

C1, C2 . . . bypass capacitor
C31, C32, C33, C34 . . . capacitor
C41, C42, C43, C44 . . . capacitor
C51, C52 . . . capacitor
C61, C62 . . . capacitor
Cd1, Cd2, Cd3, Cd4 . . . parasitic capacitance
CH . . . common mode choke coil
D1, D2, D3, D4, D5, D6 . . . Zener diode
I1, I2 . . . input terminal
N1 . . . primary winding
N2 . . . secondary winding
O1, O2 . . . output terminal
P . . . connection point
Q . . . connection point
Q1, Q2, Q3, Q4 . . . semiconductor switch
R11, R12, R21, R22, R31, R32, R41, R42, R51, R52, R61, R62 . . . resistor
S1, S2, S3, S4, S5, S6 . . . electronic switch
T . . . transformer
Vin . . . direct-current power source
1, 2, 2A, 2B, 2C, 2D, 3, 3A, 3B . . . DC-DC converter
11 . . . driving circuit
12 . . . switch element
21 . . . rectifying and smoothing circuit
22 . . . load

The invention claimed is:
1. A DC-DC converter, comprising:
a filter circuit;
a full-bridge circuit connected to the filter circuit, the full-bridge circuit including first to fourth semiconductor switches, the first and second semiconductor switches being connected in series to form a first series connected circuit, the third and fourth semiconductor switches being connected in series to form a second series connected circuit, the first and second series connected circuits being coupled in parallel to one another, each of the semiconductor switches having a source and a drain and an associated design parasitic capacitance between its source and drain;
first to fourth overvoltage protection circuits associated with the first to fourth semiconductor switches, respectively, each of the overvoltage protection circuits being connected in parallel with its associated semiconductor switch, each of the overvoltage protection circuits having a capacitance equal to the design parasitic capacitance of its associated semiconductor switch within an error range of ±5%; and a transformer having a primary winding and a secondary winding, the primary winding being connected to the full-bridge circuit, wherein each of the overvoltage protection circuits is made up of one or more capacitors.

2. A DC-DC converter, comprising:

a filter circuit;

a full-bridge circuit connected to the filter circuit, the full-bridge circuit including first to fourth semiconductor switches, the first and second semiconductor switches being connected in series to form a first series connected circuit, the third and fourth semiconductor switches being connected in series to form a second series connected circuit, the first and second series connected circuits being coupled in parallel to one another, the first and third semiconductor switches each having a source and a drain and a respective design parasitic capacitance between its source and drain;

first to fourth overvoltage protection circuits associated with the first to fourth semiconductor switches, respectively, each of the overvoltage protection circuits being connected in parallel with its associated semiconductor switch, the first and third overvoltage protection circuits having a capacitance equal to the design parasitic capacitance of its associated semiconductor switch within an error range of ±5%; and a transformer having a primary winding and a secondary winding, the primary winding being connected to the full-bridge circuit, wherein the second and fourth semiconductor switches each comprise:

a respective resistor and electronic switch connected in series with each other and in parallel with its associated semiconductor switch; and a respective switching circuit that turns on the respective electronic switch when a voltage applied to its associated semiconductor switch is greater than or equal to a respective threshold.

3. The DC-DC converter of claim 2, wherein the respective threshold is less than a withstand voltage of its associated semiconductor switch.

4. The DC-DC converter of claim 3, wherein the respective threshold is less than a value at which its associated semiconductor switch would be damaged.

5. The DC-DC converter of claim 2, wherein each of the overvoltage protection circuits has a capacitance equal to a design parasitic capacitance of its associated semiconductor switch within an error range of ±5%.

6. A DC-DC converter, comprising:

(a) a filter circuit;

(b) a full-bridge circuit connected to the filter circuit, the full-bridge circuit including first to fourth semiconductor switches, the first and second semiconductor switches being connected in series to form a first series connected circuit, the third and fourth semiconductor switches being connected in series to form a second series connected circuit, the first and second series connected circuits being coupled in parallel to one another;

(c) first to fourth overvoltage protection circuits associated with the first to fourth semiconductor switches, respectively, each of the overvoltage protection circuits being connected in parallel with its associated semiconductor switch and comprising:

(i) a respective resistor and electronic switch connected in series with each other, the series connected resistor and electronic switch being connected in parallel with its associated semiconductor switch; and (ii) a respective switching circuit that turns on the respective electronic switch when a voltage applied to its associated semiconductor switch is greater than or equal to a respective threshold that is less than a withstand voltage of its associated semiconductor switch and less than a value at which its associated semiconductor switch would be damaged; and (d) a transformer having a primary winding and a secondary winding, the primary winding being connected to the full-bridge circuit.

7. A DC-DC converter, comprising:

a filter circuit;

a half-bridge circuit connected to the filter circuit, the half-bridge circuit including first and second semiconductor switches connected in series to form a first series connected circuit and first and second capacitors connected in series with each other for form a second series connected circuit, the first and second series connected circuits being connected in parallel with one another, the first and second semiconductor switches each having a source and a drain and a respective design parasitic capacitance between its source and drain;

first and second overvoltage protection circuits associated with the first and second semiconductor switches, respectively, each of the overvoltage protection circuits being connected in parallel with its associated semiconductor switch, at least one of the overvoltage protection circuits having a capacitance equal to a design parasitic capacitance of its associated semiconductor switch within an error range of ±5%; and a transformer having a primary winding and a secondary winding, the primary winding being connected to the full-bridge circuit, wherein the first semiconductor switch has a capacitance equal to a design parasitic capacitance of its associated semiconductor switch within an error range of ±5%, and wherein the second semiconductor switch comprises:

(i) a respective resistor and electronic switch connected in series with each other, the series connected resistor and electronic switch being connected in parallel with its associated semiconductor switch; and (ii) a respective switching circuit that turns on the respective electronic switch when a voltage applied to its associated semiconductor switch is greater than or equal to a respective threshold.

8. The DC-DC converter of claim 7, wherein the respective threshold is less than a withstand voltage of the second semiconductor switch.

9. The DC-DC converter of claim 8, wherein the respective threshold is less than a value at which the second semiconductor switch would be damaged.

10. A DC-DC converter, comprising:

(a) a filter circuit;

(b) a half-bridge circuit connected to the filter circuit, the half-bridge circuit including first and second semiconductor switches connected in series to form a first series connected circuit and first and second capacitors connected in series with each other for form a second series connected circuit, the first and second series connected circuits being connected in parallel with one another;

(c) first and second overvoltage protection circuits associated with the first and second semiconductor switches, respectively, each of the overvoltage protection circuits being connected in parallel with its associated semiconductor switch and comprising:
  (i) a respective resistor and electronic switch connected in series with each, the series connected resistor and electronic switch being connected in parallel with its associated semiconductor switch; and
  (ii) a respective switching circuit that turns on the respective electronic switch when a voltage applied to its associated semiconductor switch is greater than or equal to a respective threshold that is less than a withstand voltage of its associated semiconductor switch and less than a value at which its associated semiconductor switch would be damaged; and
(d) a transformer having a primary winding and a secondary winding, the primary winding being connected to the full-bridge circuit.

* * * * *